United States Patent [19]

Farmer

[11] Patent Number: 5,025,181

[45] Date of Patent: Jun. 18, 1991

[54] APPARATUS FOR GENERATING DIGITAL GATING SIGNALS IN RESPONSE TO A DIGITAL DATA SIGNAL

[75] Inventor: Charles Farmer, Austin, Tex.

[73] Assignee: Advanced Micro Devices, Inc., Sunnyvale, Calif.

[21] Appl. No.: 576,060

[22] Filed: Aug. 31, 1990

[51] Int. Cl.$^5$ .......................................... H03K 19/094
[52] U.S. Cl. .................................... 307/571; 307/360; 307/585; 307/451
[58] Field of Search ............... 307/448, 571, 443, 451, 307/475, 579, 585, 360

[56] References Cited

U.S. PATENT DOCUMENTS

| 4,074,150 | 2/1978 | Buckley, III et al. | 307/443 |
| 4,408,135 | 10/1983 | Yuyama et al. | 307/585 |
| 4,567,385 | 1/1986 | Falater et al. | 307/451 |
| 4,682,954 | 7/1987 | McLaughlin | 307/443 |
| 4,916,337 | 4/1990 | Leung et al. | 307/475 |

FOREIGN PATENT DOCUMENTS 0075618  4/1986  Japan .................................. 307/473

Primary Examiner—David Hudspeth
Assistant Examiner—Scott A. Ouelette
Attorney, Agent, or Firm—Foley & Lardner

[57] ABSTRACT

An apparatus for generating digital gating signals respectively on an N-channel and a P-channel drive line in response to a digital data signal comprising a first and a second digital switching device, a resistive device, and first and second threshold devices for generating digital signals when receiving an input signal which exceeds a preestablished threshold value. The first and second digital switching devices commonly receive the data signal at their respective gates. The first digital switching device is operatively connected between a voltage source and the resistive device and generates a first gating signal from a juncture intermediate the first digital switching device and the resistive device. The second digital switching device is operatively connected between the resistive device and ground and generates a second gating signal from a juncture intermediate the resistive device and the second digital switching device. The first threshold device has a first preestablished threshold value, receives the first gating signal as its input signal, and generates a first digital signal representative of the first gating signal; the second threshold device has a second preestablished threshold value, receives the second gating signal as its input signal, and generates a second digital signal representative of the second gating signal. The first preestablished threshold value is preferably lower than the second preestablished threshold value.

4 Claims, 3 Drawing Sheets

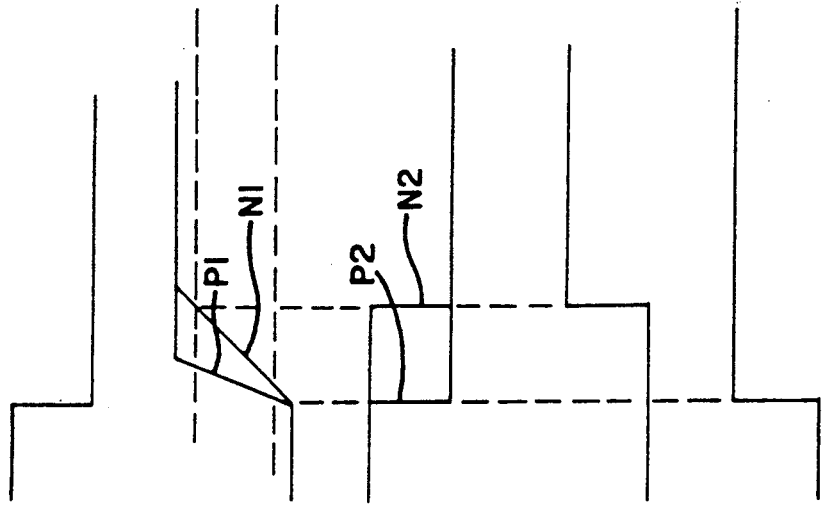
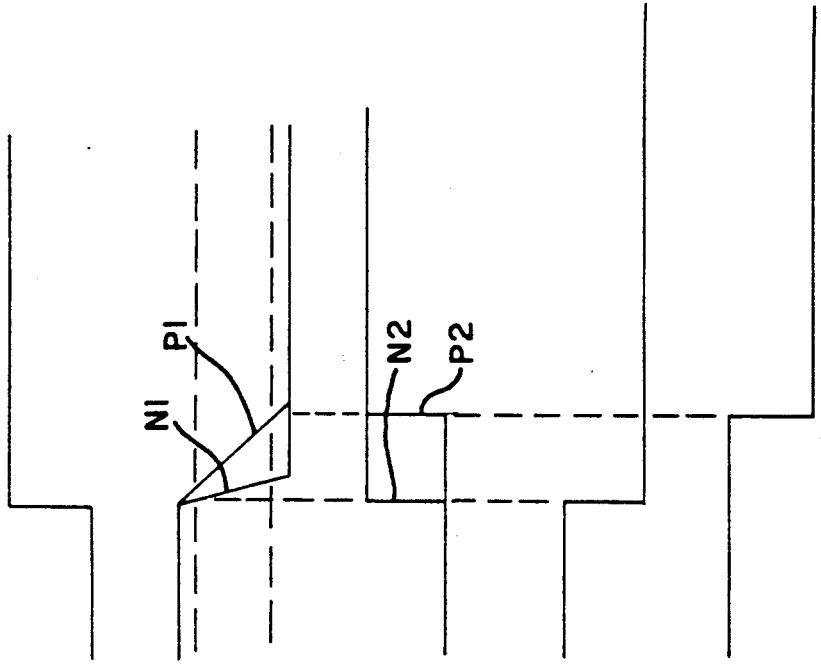
FIG-2

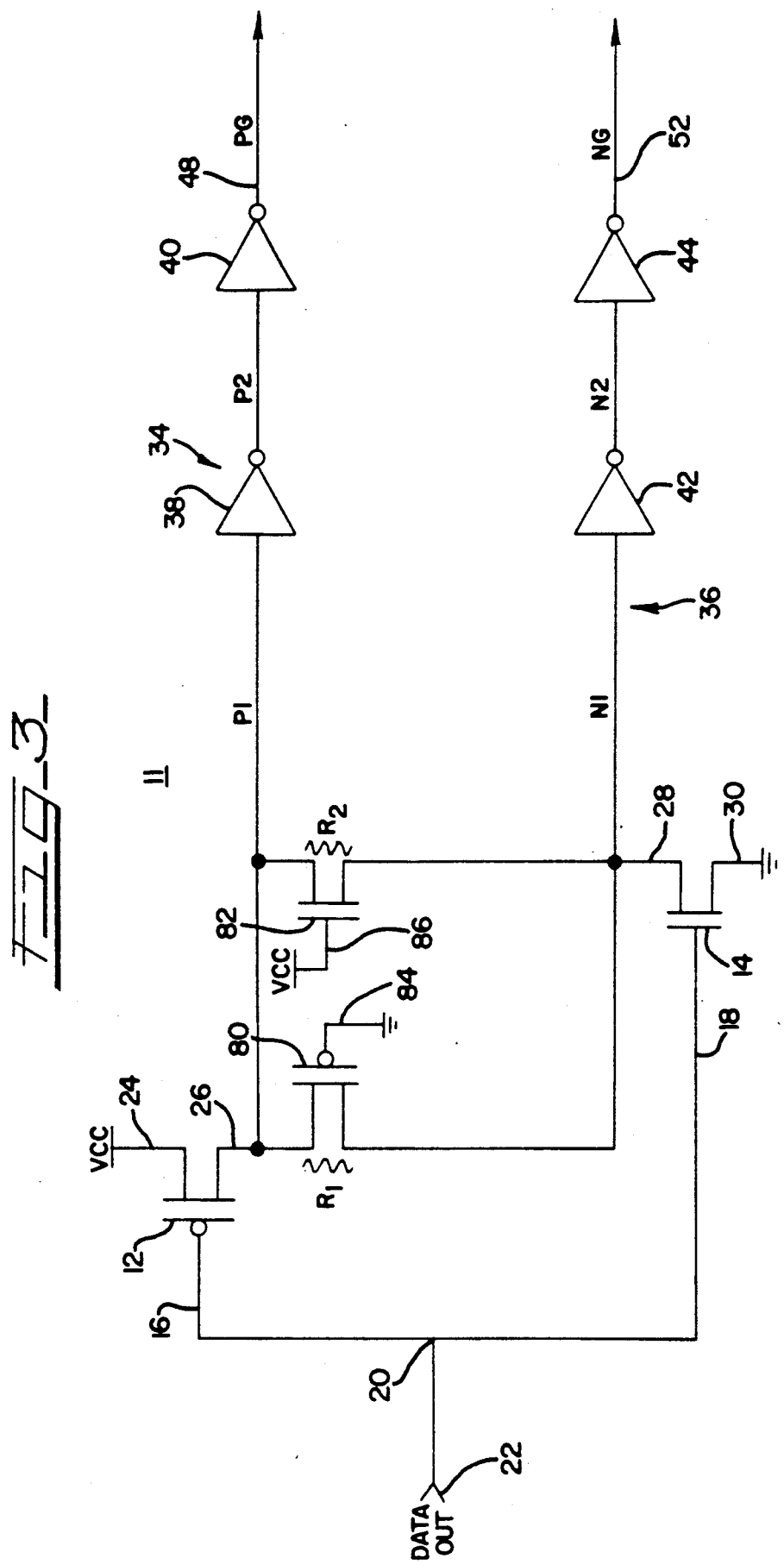

APPARATUS FOR GENERATING DIGITAL GATING SIGNALS IN RESPONSE TO A DIGITAL DATA SIGNAL

CROSS REFERENCE TO RELATED APPLICATIONS

The following applications contain subject matter similar to the subject matter of this application. (TT0082) U.S. patent application Ser. No. 576610, filed Aug. 31, 1990; entitled "Digital Apparatus for Generating Gating Signals in Response to a Data Signal"; and (TT0083) U.S. patent application Ser. No. 576006, filed Aug. 31, 1990; entitled "An Apparatus for Controlling Digital Driver Signals to Accommodate a Host System".

BACKGROUND OF THE INVENTION

The present invention is directed to an apparatus for generating a pair of digital gating signals respectively on an N-channel and a P-channel drive line in response to a digital data signal. In particular, the present invention is directed to an apparatus for generating such digital gating signals which eliminate cross-current between the N-channel and P-channel drive lines without sacrificing output switching speed.

Such elimination of cross-current reduces high frequency noise generated by a high speed drive output buffer such as is contemplated to be driven by the present invention.

In its preferred embodiment, the present invention is implemented as a CMOS integrated circuit, thereby providing additional advantages of reduced board space occupancy and reduced power consumption over non-integrated circuit embodiments.

SUMMARY OF THE INVENTION

The invention is an apparatus for generating a pair of digital gating signals respectively on an N-channel and a P-channel drive line in response to a digital data signal and comprises a first digital switching device and a second digital switching device for switching digital signals, a resistive device for establishing resistance in a circuit path, and first and second threshold devices for generating digital signals when receiving an input signal which exceeds a preestablished threshold value.

The first and second digital switching devices commonly receive the data signal at their respective gates. The first digital switching device is operatively connected between a voltage source and the resistive device and generates a first gating signal of the pair of gating signals from a juncture intermediate the first digital switching device and the resistive device. The second digital switching device is operatively connected between the resistive device and ground and generates a second gating signal of the pair of gating signals from a juncture intermediate the resistive device and the second digital switching device.

The first threshold device has a first preestablished threshold value and receives the first gating signal as its input signal and generates a first digital signal representative of the first gating signal; the second threshold device has a second preestablished threshold value, receives the second gating signal as its input signal, and generates a second digital signal representative of the second gating signal. Preferably, the first digital switching device is configured as a pull-up digital switch and the second digital switching device is configured as a pull-down digital switch. The first preestablished threshold value is preferably lower than the second preestablished threshold value.

It is, therefore, an object of the present invention to provide an apparatus for generating a pair of digital gating signals on two drive lines in response to a digital data signal which eliminates cross-current between the two drive lines.

A further object of the present invention is to provide an apparatus for generating a pair of digital gating signals on two drive lines in response to a digital data signal which generates less high frequency noise during switching operations than is generated by prior art devices, without sacrificing switching speed.

Still a further object of the present invention is to provide an apparatus for generating a pair of digital gating signals on two drive lines in response to a digital data signal which is embodied as a CMOS integrated circuit with its attendant advantages of reduced power consumption and reduced board occupancy.

Further objects and features of the present invention will be apparent from the following specification and claims when considered in connection with the accompanying drawings illustrating the preferred embodiment of the invention.

DETAILED DESCRIPTION OF THE DRAWINGS

FIG. 2($a$–$b$) is a schematic illustration of selected wave forms at various locations within apparatus 10.

FIG. 3 is an electrical schematic of a CMOS implementation of the preferred embodiment of the present invention.

DETAILED DESCRIPTION OF THE INVENTION

Figure 1:
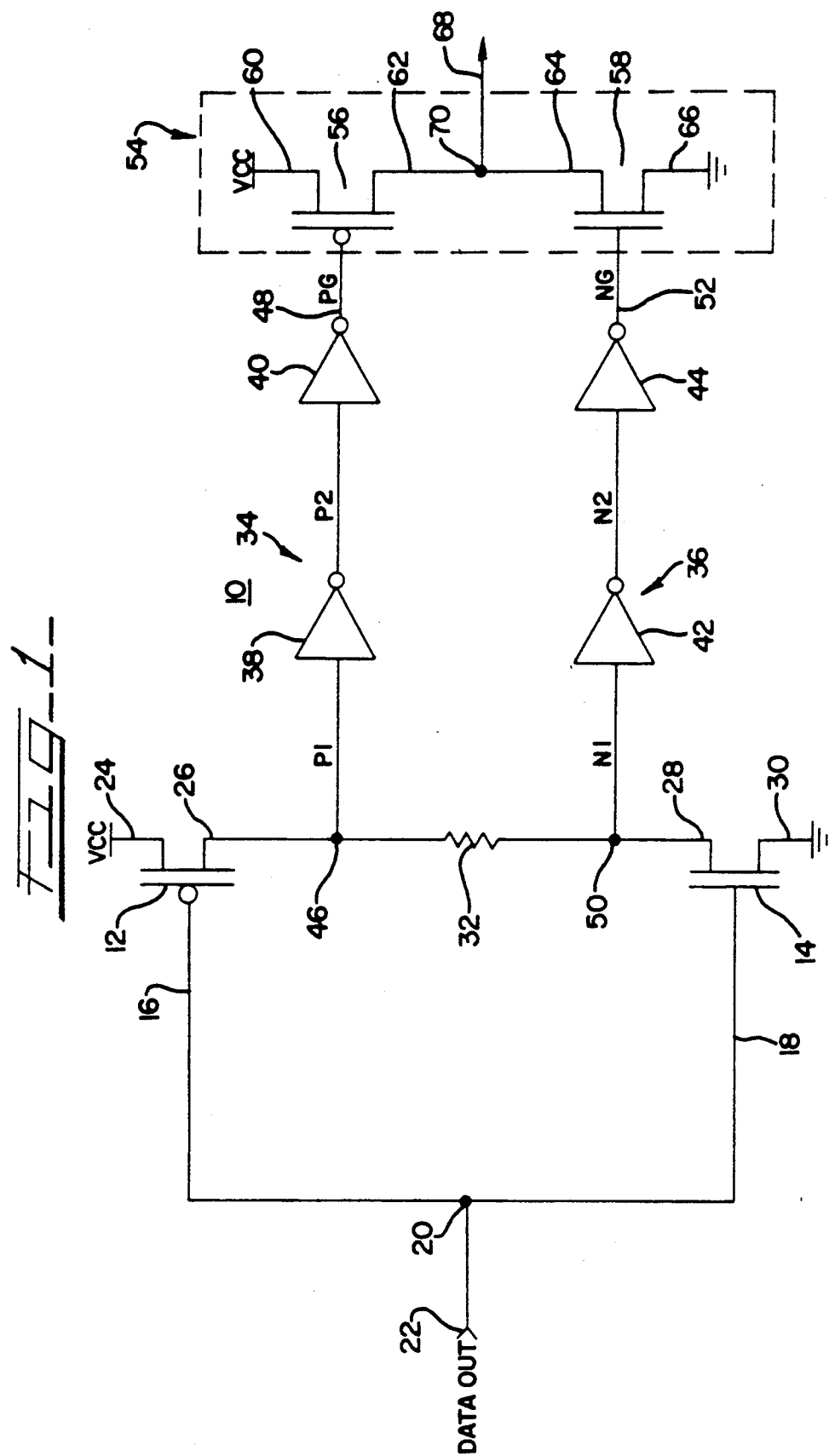
FIG. 1 is an electrical schematic diagram of the preferred embodiment of the present invention.

FIG. 1 is an electrical schematic diagram of the preferred embodiment of the present invention. In FIG. 1, an apparatus 10 is illustrated comprising a P-channel field effect transistor (FET) 12 and an N-channel FET 14. Gate 16 of P-channel FET 12 and gate 18 of N-channel FET 14 are commonly connected at a juncture 20. Juncture 20 is connected with input pin 22 at which digital data signals are received by apparatus 10.

The preferred employment of the apparatus 10 is as a drive circuit for an output buffer for a data generating device, such as a computing device. Thus, in its preferred employment, apparatus 10 is receiving at input pin 22 a DATA OUT signal from a computing device or similar device. P-channel FET 12 is operatively connected to switchingly pass VCC, received at pole 24, to pole 26 in response to signals received at gate 16. N-channel FET 14 is operatively connected to pass signals present at pole 28 to ground, connected to pole 30, in response to signals received at gate 18. Intermediate poles 26, 28 is a resistive element 32.

Electrically connected intermediate P-channel FET 12 and resistive device 32 is P-channel gating signal drive line 34, and electrically connected intermediate N-channel FET 14 and resistive device 32 is N-channel gating signal drive line 36. P-channel gating signal drive line 34 includes inverter 38 and inverter 40; N-channel gating signal drive line 36 includes inverter 42 and inverter 44.

Thus, as illustrated in FIG. 1, a signal P1 is carried on P-channel gating signal drive line 34 between juncture 46, which is intermediate pole 26 of P-channel FET 12 and resistive device 32, and inverter 38. A signal P2 is present on P-channel gating signal drive line 34 intermediate inverter 38 and inverter 40. A signal PG, the P-channel gating signal produced by apparatus 10, is produced at output 48 of inverter 40.

Similarly, N-channel gating signal drive line 36 carries a signal N1 between juncture 50, which is intermediate pole 28 of N-channel FET 14 and resistive device 32, and inverter 42. A signal N2 is carried on N-channel gating signal drive line 36 intermediate inverter 42 and inverter 44, and the N-channel gating signal output of apparatus 10 is produced at output 52 of inverter 44.

P-channel gating signal PG and N-channel gating signal NG are applied as inputs to an output buffer 54. Output buffer 54 is represented in this exemplary embodiment as P-channel FET 56 and N-channel FET 58 respectively gated by P-channel gating signal PG and N-channel gating signal NG. P-channel FET 56 and N-channel FET 58 are connected to selectively gate a reference voltage VCC from a pole 60 to a pole 62 and, further, to gate signals appearing at a pole 64 to ground, connected to a pole 66. The output 68 of output buffer 54 is produced from juncture 70 intermediate poles 62, 64.

In the preferred embodiment of the present invention, inverters 38, 42 are chosen so that inverter 38 has a low threshold voltage and inverter 42 has a high threshold voltage. The effect of such chosen thresholds is best illustrated by referring to FIG. 2.

FIG. 2 is a schematic illustration of selected wave forms at various locations within apparatus 10. In FIG. 2(a), the effect of a transition of DATA OUT from low to high is illustrated. When DATA OUT is low, P-channel FET 12 is gated-on, thus operatively connecting VCC from pole 24 through pole 26 to juncture 46, and to juncture 50 through resistive device 32. N-channel FET 14 is gated-off, isolating junctures 46, 50 from ground. Thus, when DATA OUT is low, signals P1, N1 are high. Consequently, signals P2, N2 are low and signals NG, PG are high.

When DATA OUT changes from low to high, the inherent capacitance of the inputs of inverters 38, 42 combine with the resistance of resistive device 32 to create an RC time circuit which causes a ramping down of signals N1, P1, as illustrated in FIG. 2(a). As signal N1 crosses the high threshold established for inverter 42, signal N2 transitions from low to high, which transition is substantially instantaneous since no significant resistance is associated in the circuit with respect to inverters 40 or 44. Similarly, as signal P1 passes the lower threshold associated with inverter 38, signal P2 transitions from low to high. Thus, by selecting appropriately displaced thresholds for inverters 38, 42, the transition of signal N2 from low to high is ensured to be time-displaced from the transition of signal P2 from low to high.

A similar, mirror-image sequence occurs when DATA OUT transitions from high to low, as illustrated in FIG. 2(b). Thus, when DATA OUT is high, P-channel FET 12 is gated-off and N-channel 14 is gated-on, thereby operatively connecting both junctures 46 and 50 to ground through poles 28, 30. When DATA OUT is high, signals P1, N1 are low. When DATA OUT transitions from high to low, the RC time circuit established by resistive device 32 and the input capacitances of inverters 38, 40 causes a ramping up of signals N1, P1. As signal P1 exceeds the low threshold established in connection with inverter 38, signal P2 transitions from high to low. Similarly, as signal N1 exceeds the high threshold associated with inverter 42, signal N2 transitions from high to low. In such manner, there is an assured time displacement between transitions from low to high of signals PG, NG.

In order to facilitate understanding of the present invention, similar elements will be identified by similar reference numerals in the various drawings.

FIG. 3 is an electrical schematic of a CMOS implementation of the preferred embodiment of the present invention. In FIG. 3, a data signal DATA OUT is applied at an input pin 22 which is operatively connected with juncture 20. Juncture 20 is electrically common with gate 16 of P-channel FET 12 and gate 18 of N-channel FET 14. P-channel FET 12 is connected to gate VCC through its pole 24 to its pole 26 in response to signals applied to gate 16; N-channel FET 14 is connected to gate signals appearing at its pole 28 to ground through its pole 30 in response to signals applied to its gate 18. Intermediate pole 26 and pole 28 are parallel-connected FETs: P-channel FET 80 and N-channel FET 82. Gate 84 of P-channel FET 80 is connected to ground, thereby maintaining P-channel FET 80 in a gated-on condition. Similarly, gate 86 of N-channel FET 82 is connected to VCC, thereby maintaining N-channel FET 82 in a gated-on condition. Thus, there is presented between pole 26 of P-channel FET 12 and pole 28 of N-channel FET 14 a resistive array comprising the inherent resistance $R_1$ of P-channel FET 80 and resistance $R_2$ of N-channel FET 82 connected in parallel. It may be seen by one skilled in the art that the embodiment of apparatus 11 in FIG. 3 is the electrical equivalent of apparatus 10, illustrated in FIG. 1. The advantage of apparatus 11 (FIG. 3) is that FETs, such as P-channel FET 80 and N-channel FET 82, occupy less board space in CMOS implementation than does a resistive device; such as resistive device 32 of apparatus 10 (FIG. 1). P-channel gating signal drive line 34 and N-channel gating signal drive line 36 are configured the same in apparatus 11 (FIG. 3) as in apparatus 10 (FIG. 1). Accordingly, the performance of apparatus 11 (FIG. 3) is substantially the same as the performance of apparatus 10 (FIG. 1) and the explanation in connection with FIG. 2 applies equally to apparatus 11 (FIG. 3) as it does to apparatus 10 (FIG. 1).

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims:

I claim:

1. An apparatus for generating a pair of digital gating signals in response to a digital data signal, the apparatus comprising:

a first and a second digital switching means for switching digital signals;

a resistive means for establishing resistance in a circuit path; and first and second threshold means for generating digital signals when receiving an input signal which exceeds a preestablished threshold value;

said first and second digital switching means commonly receiving said data signal at their respective gates;

said first digital switching means being operatively connected between a voltage source and said resistive means and generating a first gating signal of said pair of gating signals intermediate said first digital switching means and said resistive means;

said second digital switching means being operatively connected between said resistive means and ground and generating a second gating signal of said pair of gating signals intermediate said resistive means and said second digital switching means;

said first threshold means having a first preestablished threshold value receiving said first gating signal as said input signal, and generating a first digital signal representative of said first gating signal;

said second threshold means having a second preestablished threshold value, receiving said second gating signal as said input signal, and generating a second digital signal representative of said second gating signal;

said first digital switching means being configured as a pull-up digital switch, said second switching means being configured as a pull-down digital switch, and said first preestablished threshold value being lower than said second preestablished threshold value.

2. An apparatus for generating a pair of digital gating signals in response to a digital data signal as recited in claim 1 wherein said first digital switching means comprises a P-channel field effect transistor device, and said second digital switching means comprises an N-channel field effect transistor device.

3. An apparatus for generating a pair of digital gating signals in response to a digital data signal as recited in claim 1 wherein said each of first and second threshold means comprise a threshold shifted inverter in series with an inverter.

4. An apparatus for generating a pair of digital gating signals in response to a digital data signal as recited in claim 2 wherein said each of first and second threshold means comprise a threshold shifted inverter in series with an inverter.

* * * * *